United States Patent
Fisher et al.

(10) Patent No.: US 9,041,286 B2
(45) Date of Patent: May 26, 2015

(54) VOLUMETRIC LIGHT EMITTING DEVICE

(71) Applicant: Venntis Technologies LLC, Holland, MI (US)

(72) Inventors: Daniel J. Fisher, Holland, MI (US); David W. Caldwell, Holland, MI (US); Justin T. Teitt, Holland, MI (US); Jamie C. Caldwell, Holland, MI (US); William D. Schaefer, Holland, MI (US)

(73) Assignee: VENNTIS TECHNOLOGIES LLC, Holland, MI (US)

( * ) Notice: Subject to any disclaimer, the term of this patent is extended or adjusted under 35 U.S.C. 154(b) by 0 days.

(21) Appl. No.: 14/290,043

(22) Filed: May 29, 2014

(65) Prior Publication Data

US 2014/0354145 A1    Dec. 4, 2014

Related U.S. Application Data

(60) Provisional application No. 61/828,428, filed on May 29, 2013.

(51) Int. Cl.
F21K 99/00    (2010.01)
(52) U.S. Cl.
CPC .... F21K 9/54 (2013.01); F21K 9/56 (2013.01)
(58) Field of Classification Search
USPC ............. 313/512, 511, 498, 507; 362/249.02, 362/626
See application file for complete search history.

(56) References Cited

U.S. PATENT DOCUMENTS

| | | | |
|---|---|---|---|
| 8,646,949 B2 | 2/2014 | Brunt, Jr. et al. | |
| 2002/0057057 A1* | 5/2002 | Sorg | 313/512 |
| 2008/0064287 A1 | 3/2008 | Ng et al. | |
| 2009/0262516 A1 | 10/2009 | Li | |
| 2011/0215700 A1 | 9/2011 | Tong et al. | |
| 2013/0241404 A1* | 9/2013 | Guschl et al. | 313/512 |
| 2014/0374780 A1* | 12/2014 | Schaefer et al. | 257/88 |

FOREIGN PATENT DOCUMENTS

JP    2005-033122 A    2/2005
JP    2007-531318 A    11/2007

OTHER PUBLICATIONS

PCT Notification of Transmittal of the International Search Report and the Written Opinion of the International Searching Authority; mailed Oct. 16, 2014; 12 pages.

* cited by examiner

*Primary Examiner* — Tracie Y Green
(74) *Attorney, Agent, or Firm* — McGarry Bair PC

(57) ABSTRACT

A volumetric light emitting device includes a substrate, a semiconductor light emitting diode disposed on the substrate and a reflector ring extending axially from the substrate. The reflector ring defines a first volume bounded by the substrate, an inner wall of the reflector ring, and a terminal plane at a distal end of the reflector ring. An encapsulant fills the first volume and encapsulates the semiconductor light emitting diode. A volumetric light conversion element surrounds the reflector ring and the first volume wherein the volumetric light conversion element is adapted to down-convert light emitted from the semiconductor light emitting diode at a first wavelength and emit the down-converted light at a second wavelength. A second volume of encapsulant or scattering material extends axially between the terminal plane and the volumetric light conversion element.

17 Claims, 12 Drawing Sheets

VOLUMETRIC LIGHT EMITTING DEVICE

This application claims the benefit of U.S. Provisional Application No. 61/828,428, filed May 29, 2013, which is incorporated herein by reference in its entirety.

FIELD OF THE INVENTION

This invention relates generally to light sources and the manufacturing of light sources, and more particularly for solid-state light sources.

BACKGROUND OF THE INVENTION

Light emitting diodes (LEDs) are solid-state devices that produce light by electroluminescence; that is, the optical phenomenon whereby a material emits light in response to an electric current. One common type of white light LED includes a phosphor powder blend mixed with a resin and deposited as a layer onto the surface of an optical emitter junction. The phosphor blend absorbs blue or UV wavelength light and reemits down-converted broadband green to red wavelength light.

As shown in FIG. 1, it is known to form a white light LED as a volumetric light emitting device 10 where the phosphor blend is molded into a three-dimensional or volumetric light conversion element 12. The volumetric light emitting device 10 includes a first reflector 14 including an aperture 16 for a light source 18 or an emitter junction, a second reflector 20 opposite the first reflector 14 for reflecting light emitted by the light source 18, and a volumetric light conversion element 12 extending between at least a portion of the first reflector 14 and at least a portion of the second reflector 20. The volumetric light conversion element 12 includes phosphor particles 22 dispersed in a resin to convert light emitted by the light source 18 from a first wavelength 24 to a second wavelength 26, the second wavelength 26 being longer than the first wavelength 24. In this way, the volumetric light emitting device 10 manages and distributes blue light and down-converted white light. Specifically, the volumetric light emitting device 10 radiates the down-converted light in a toroidal or spherical pattern. An example of a volumetric light-emitting device is illustrated by Brunt et al. U.S. Pat. No. 8,646,949.

In most LED lighting applications, the management of heat is critical to the operability of the lighting device. An LED maintaining a lower junction temperature has a longer life expectancy than an LED operated at a higher junction temperature. For lighting applications where LEDs are coated with phosphors, the heat generated by the LED and the heat generated by phosphor down-conversion is typically absorbed and transferred within a heat sink attached either directly to the LED or the printed circuit board (PCB) upon which the LED is mounted. In this way, conventional LED lighting applications rely on the design of the heat sink to maintain the life expectancy of the light source by maintaining a desired LED's junction temperature.

In a volumetric light emitting device 10 of the type described in FIG. 1, the phosphor material that forms the volumetric light conversion element 12 is not located on or directly adjacent to the LED light source 18 and the corresponding heat sink (not shown, but either directly attached to the LED light source 18 or the PCB 19). Consequently, much of the heat generated from down-conversion does not transfer efficiently to the heat sink.

Referring now to FIG. 2, a hot spot 28 can be formed in the volumetric light emitting device 10 as shown. Light with a first wavelength 24 emitted from the LED light source 18 passes through a clear encapsulant 17, excites a phosphor 22, 30 that emits light of a down-converted second wavelength 26 within the volumetric light conversion element 12 and generates heat. The heat will then generally find an exit path through the resin material in which the phosphors 22, 30 are embedded, transfer to the sides and top of the volumetric light conversion element 12 and dissipate through convection, conduction or radiation.

The hot spot 28 is a localized volume in the volumetric light conversion element 12 where a concentration of down-conversion creates a localized higher temperature with respect to the overall average temperature of the volumetric light conversion element 12. A higher localized temperature may prematurely degrade the phosphor materials, the resin material, and encapsulant. Furthermore, phosphors become less efficient at higher temperatures emitting less light than at lower temperatures. The hot spot 28 occurs, in part, because the phosphors 26, 30 are dispersed in a homogenous fashion throughout the resin that defines the volumetric light conversion element 12. The host resin material may include many materials, such as a hardened silicone. The thermal conductivity for such a host material is typically much less than the thermal conductivity of the heat sink material, which is often aluminum or a highly thermally conductive thermoplastic. Hot spots are especially problematic if the heat created exceeds the material property specification of the resin material, the encapsulant or the phosphor materials.

Despite the homogeneous distribution of the phosphors in the volumetric light conversion element 12, the distribution of the excitation of the phosphors 22, 30 in the volumetric light emitting device 10 is not homogeneous throughout the volumetric light conversion element 12. Rather, there is a higher concentration of phosphor excitement where the light of the first wavelength 24 from the LED light source 18 initially contacts the phosphors 30 at the interface 34 between encapsulant 17 and the volumetric light conversion element 12. With an axially symmetric volumetric light emitting device 10, where the axis of symmetry 32 is vertical and intersects the center of the LED light source 18, the area of the interface 34 is defined by a circle. The volume defined by the area of the interface 34 and extending along the axis of symmetry 32 forms the previously described hot spot 28.

For example, a typical volumetric light emitting device 10 may have an interface 34 with a radius of approximately 4.45 millimeters (mm) and a corresponding area of approximately 62.2 mm$^2$. As much as 30 to 70 percent of the down-conversion from a first wavelength to a second wavelength may occur in the volume described approximately by the area of the interface 34 extending approximately 3 mm vertically along the axis of symmetry 32.

Additionally, the high concentration of phosphor excitement at the interface 34 just above the encapsulant 17 results in down-converted light 36 traveling back down into the area of the LED light source 18. The down-converted light 36 heats the LED light source 18, shortening the life expectancy of the LED light source 18. By not exiting through the exterior walls of the volumetric light conversion element 12, the down-converted light 36 directed back at the LED light source 18 contributes to a reduction in the overall efficiency of the volumetric light emitting device 10.

The maximum temperature inside the volumetric light conversion element 12 depends on several factors including the output power of the LED light source 18, the interface area between the encapsulant and the phosphors, the type of phosphors 22, 30, the thermal conductivity of the materials, the exterior geometry, and the ambient temperature surrounding the volumetric light conversion element 12. Many of the LED light sources used today have very high power densities emitting a lot of light into a very small area. To prolong the life expectancy and maximize efficiency of the volumetric light conversion element 12, the volumetric light emitting device 10 may include elements to mitigate the overall heat generated by the down-conversion from a first wavelength to a second wavelength and minimize areas where hot spots are created. Increasing the area of the interface between the encapsulant material and the phosphor particles dispersed in resin increases the volume where the light of the first wavelength from the LED light source initially contacts the phosphor. As the light excites the phosphors, the heat generated by down-conversion may disperse over a wider area, thus minimizing the intensity and volume of a potential hot spot. Additionally, the increased interface area reduces the amount of down-converted light directed back into the LED light source.

BRIEF DESCRIPTION OF THE INVENTION

One aspect of the invention relates to a volumetric light emitting device having a substrate and one or more semiconductor light emitting diodes disposed on the substrate. A reflector ring extends axially from the substrate and surrounds the semiconductor light emitting diode. The reflector ring defines a first volume bounded by the substrate, an inner wall of the reflector ring, and a terminal plane at a distal end of the reflector ring. An encapsulant fills the first volume and encapsulates the semiconductor light emitting diode. A volumetric light conversion element surrounds the reflector ring and the first volume wherein the volumetric light conversion element is adapted to down-convert light emitted from the semiconductor light emitting diode at a first wavelength and emit the down-converted light at a second wavelength. A second volume of encapsulant or scattering material extends axially between the terminal plane and the volumetric light conversion element.

DESCRIPTION OF EMBODIMENTS OF THE INVENTION

In the background and the following description, for the purposes of explanation, numerous specific details are set forth in order to provide a thorough understanding of the technology described herein. It will be evident to one skilled in the art, however, that the exemplary embodiments may be practiced without these specific details. In other instances, structures and device are shown in diagram form in order to facilitate description of the exemplary embodiments.

Figure 1:
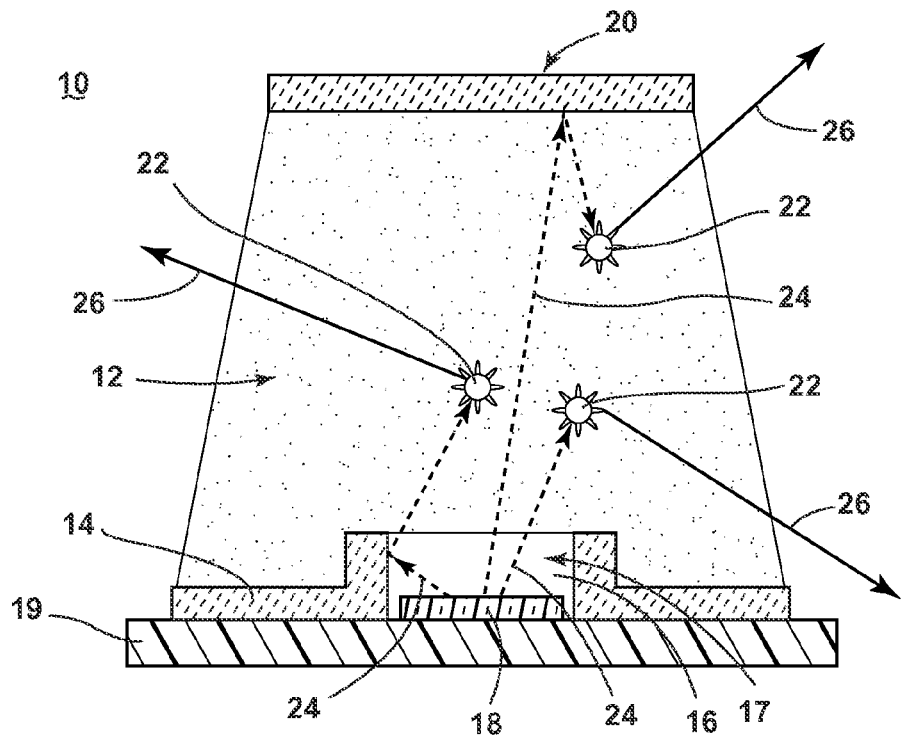
FIG. 1 illustrates a cross-sectional view of a prior art volumetric light emitting device.
Figure 2:
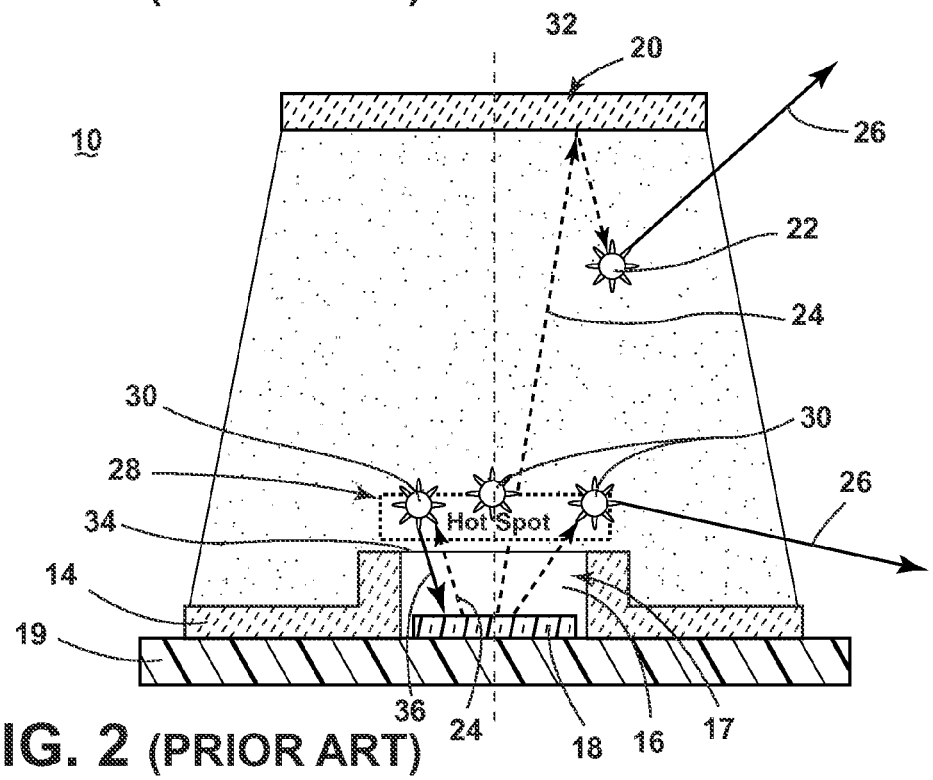
FIG. 2 illustrates a hot spot in the volumetric light emitting device of FIG. 1.
Figure 3:
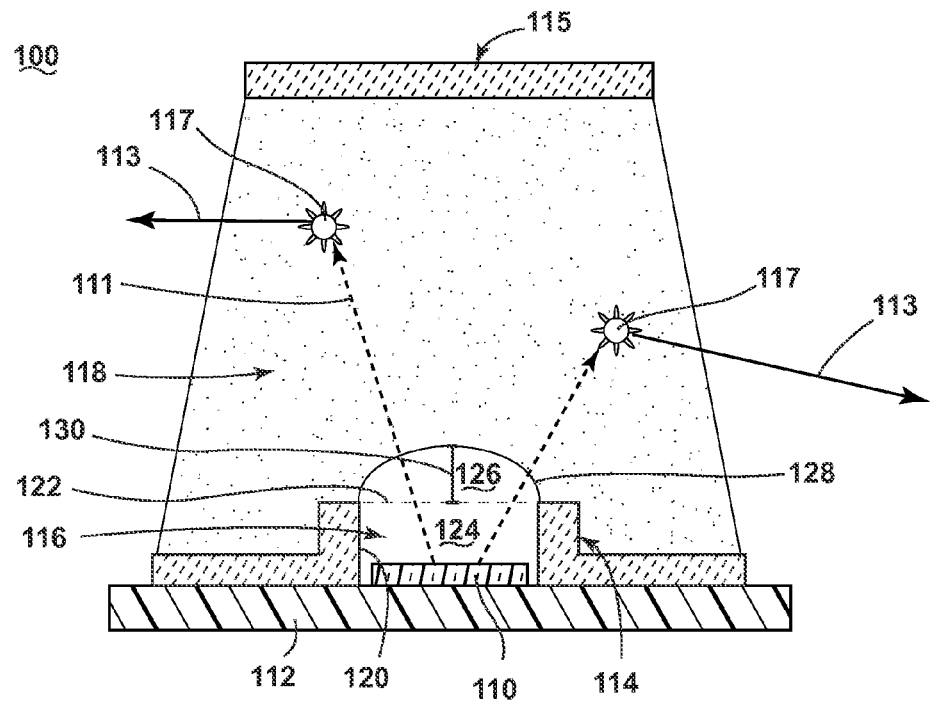
FIG. 3 illustrates a cross-sectional view of a volumetric light emitting device with a dome encapsulant.

FIG. 3 shows a cross section of a generally circular volumetric light emitting device 100 according to a first embodiment with a greater area of the interface 128 between an encapsulant 116 and phosphor particles 117 in the volumetric light conversion element 118 than is known in the prior art. The volumetric light emitting device 100 includes at least one semiconductor LED light source 110 disposed on a substrate 112. A reflector ring 114 extends axially from the substrate 112. The reflector ring surrounds the LED light source 110 and serves to reflect or redirect upward any side-emitted light from the LED. The encapsulant 116 encases the LED light source 110. A volumetric light conversion element 118 surrounds the reflector ring 114. The volumetric light conversion element 118 is adapted to down-convert light emitted from the LED light source 110 at a first wavelength 111 and emit the down-converted light at a second wavelength 113 as described above and includes the phosphor particles 117 dispersed in a host resin material. The phosphor mix may be formed of phosphors, such as EY4453 by Intermatix, premixed into an acrylic, silicone, polycarbonate, Nylon, or other resins for injection molding. The encapsulant may include, for example, silicone.

The reflector ring 114 defines a first volume 124 that is bounded by the substrate 112, an inner wall 120 of the reflector ring 114 and a terminal plane 122 at a distal end of the reflector ring 114. A second volume 126 extends axially between the terminal plane 122 and the volumetric light conversion element 118. An upper reflector 115 spaced axially from the terminal plane 122 may provide an upper boundary for the volumetric light conversion element 118.

The height of the reflector ring may be close to or equal to the thickness of other lower reflector elements disposed on the substrate, or extend axially above the other lower reflector elements; the design height determined by desired optical parameters. The reflector ring may be molded or manufactured integral with the other lower reflector elements or the reflector ring may be separate from the other elements of the lower reflector. Additionally, it is contemplated that the lower reflector only comprises a reflector ring wherein portions of the substrate directly contacts the volumetric light conversion element 118 and may be reflective. The inner wall of the reflector ring can be a flat or curved surface formed to direct reflected light in optimal directions.

The second volume 126 may be formed as a dome and the encapsulant 116 fills both the first and second volumes 124, 126. By adding a dome of encapsulant at the top of the terminal plane 122, the surface area of the interface 128 between the encapsulant 116 and the volumetric light conversion element 118 is larger than if it were in a plane as in the prior art. That is, the area of the interface 128 is larger than that of the area of the intersection between the first and second volumes 124,126. For example, by adding the second volume 126 of encapsulant 116 in the shape of a dome with a height 130 of 3 mm above the reflector ring 114, the surface area of the interface 128 increases from 62.2 mm$^2$ to 90.4 mm$^2$; an increase of approximately 45 percent.

Figure 4:
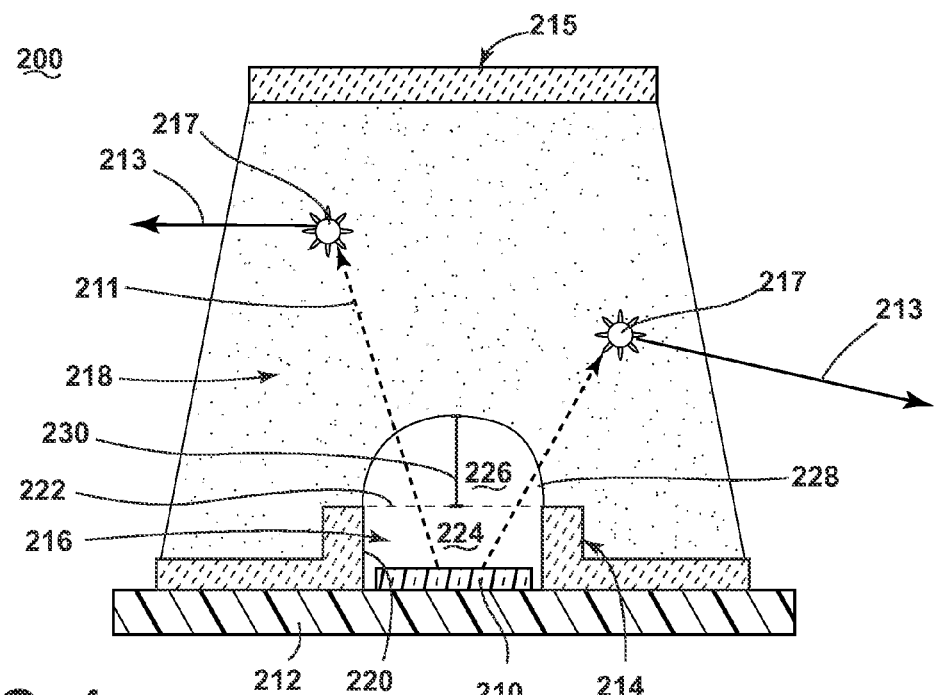
FIG. 4 illustrates a cross-sectional view of a volumetric light emitting device with a hemispherical encapsulant.

FIG. 4 illustrates an alternative volumetric light emitting device 200 according to a second embodiment of the invention. The second and subsequent embodiments may be similar to the first embodiment; therefore, like parts will be identified with like numerals increased by 100, with it being understood that the description of the like parts of the first embodiment applies to the second and subsequent embodiments, unless otherwise noted. A difference between the first embodiment and the second embodiment may be that the second volume 226 may be arranged in a hemispherical configuration, instead of the substantially domed configuration of the first embodiment. Expanding upon the example set forth above, by adding the second volume 226 of encapsulant 216 in the shape of a hemisphere with a height 230 of 4.45 mm above the reflector ring 214, the surface area of the interface 228 increases to 124.4 mm$^2$; an increase of approximately 100 percent.

Figure 5:
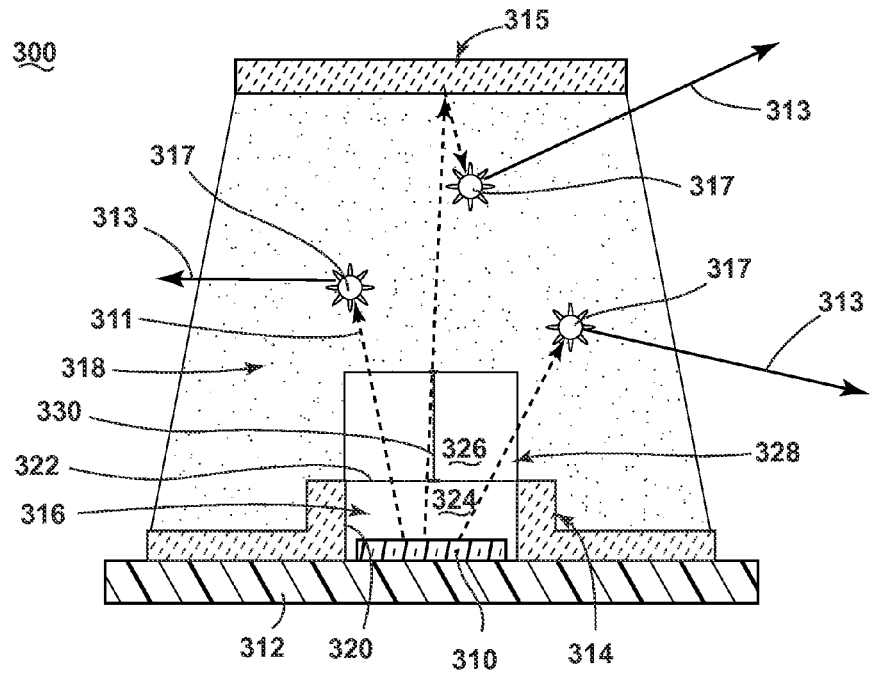
FIG. 5 illustrates a cross-sectional view of a volumetric light emitting device with a cylindrical encapsulant.

FIG. 5 illustrates an alternative volumetric light emitting device 300 according to a third embodiment of the invention. A difference between the first embodiment and the third embodiment may be that the second volume 326 may be arranged in a cylindrical configuration. Expanding again upon the example set forth above, by adding a second volume 326 of encapsulant 316 in the shape of a cylinder with a height 330 of 6 mm above the reflector ring 314, the surface area of the interface 328 includes the 62.2 mm$^2$ for the circular base area 329 at the top of the cylinder and the 167.7 mm$^2$ for the lateral area 331 for a total area of 229.9 mm$^2$; an increase of 269 percent.

Figure 6:
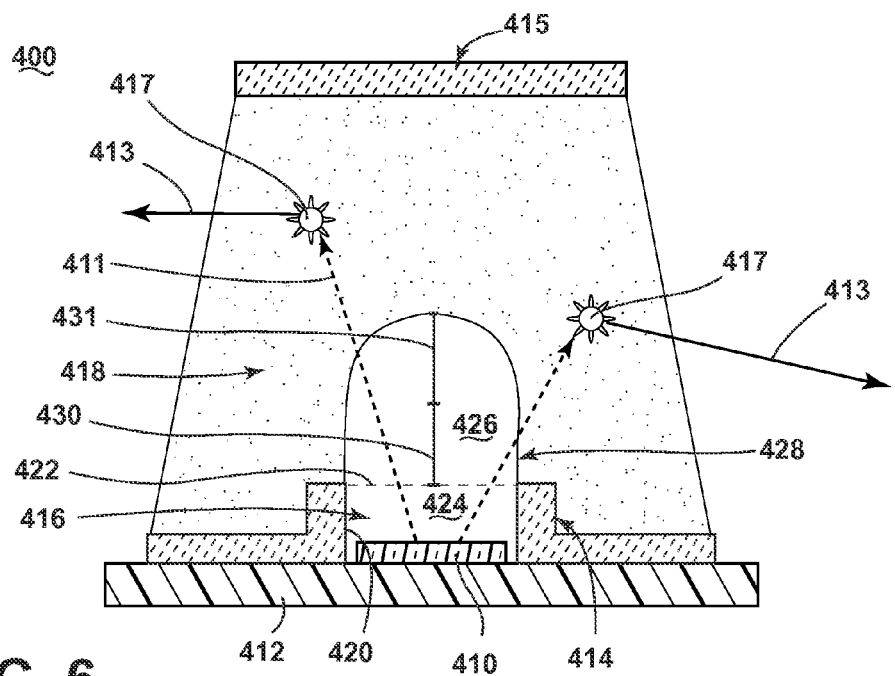
FIG. 6 illustrates a cross-sectional view of a volumetric light emitting device with a cylindrical encapsulant.

FIG. 6 illustrates another alternative volumetric light emitting device 400 according to a fourth embodiment of the invention. The second volume 426 may formed as a composite solid that is a combination of more than one geometrical shape. As shown, the second volume 426 may be arranged as a combination of a cylinder and hemisphere. Expanding again upon the example set forth above, by adding a second volume 426 of encapsulant 416 in the shape of a cylinder with a height 430 of 6 mm above the reflector ring 414 combined with a hemisphere with a height 431 of 4.45 mm above the upper base of the cylinder, the surface area of the interface 428 increases to approximately 292.0 mm$^2$; an increase of 370%.

Figure 7:
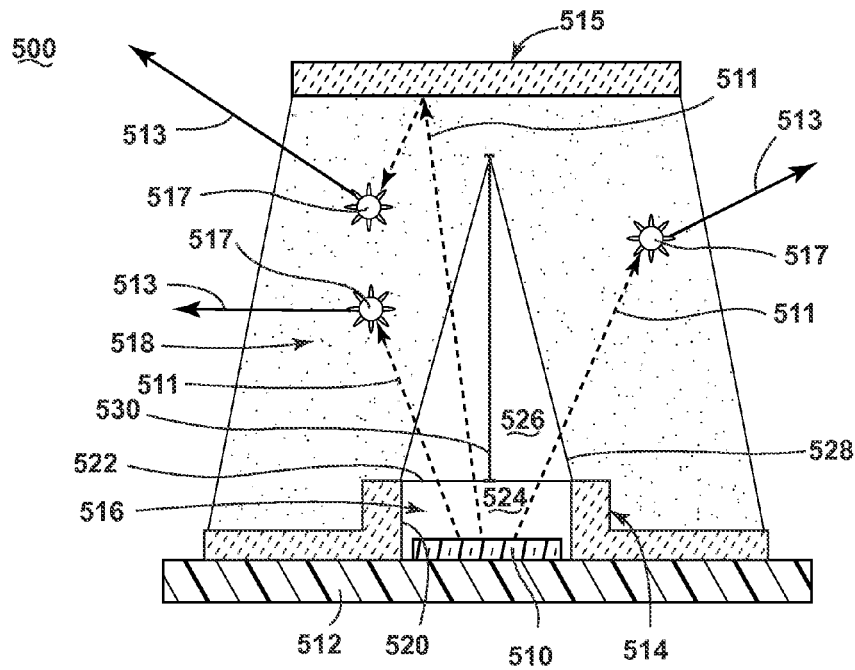
FIG. 7 illustrates a cross-sectional view of a volumetric light emitting device with a conic encapsulant.

FIG. 7 illustrates another alternative volumetric light emitting device 500 according to a fifth embodiment of the invention. The second volume 526 may be arranged in a conical configuration. As shown, continuing with the example set forth above, by adding the second volume 526 of encapsulant 516 in the shape of a hemisphere with a height 530 of 15 mm above the reflector ring 514, the surface area of the interface 528 increases to 218.6 mm$^2$; an increase of approximately 152 percent.

Figure 8:
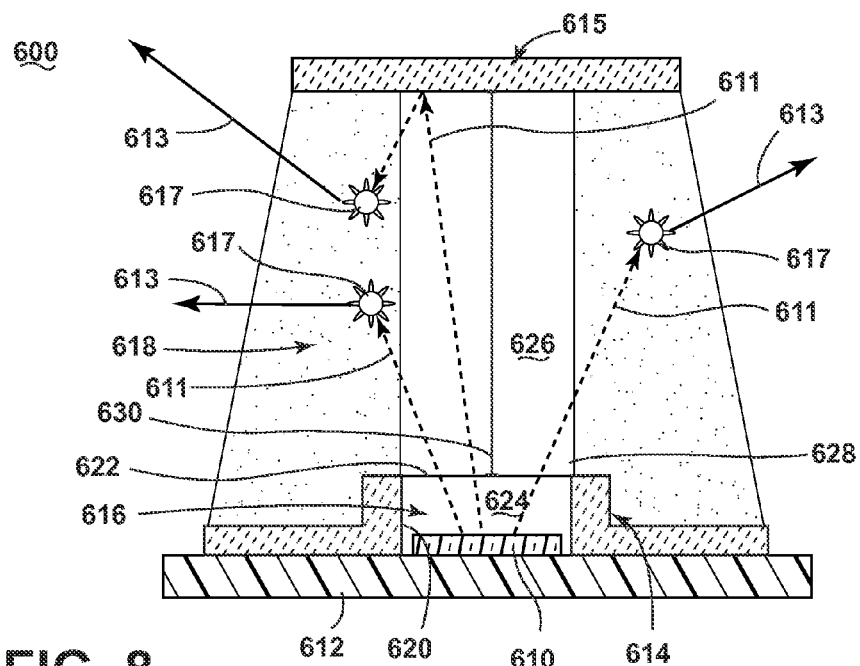
FIG. 8 illustrates a cross-sectional view of a volumetric light emitting device with an extended cylindrical encapsulant.

FIG. 8 illustrates another alternative volumetric light emitting device 600 according to a sixth embodiment of the invention. The dimensions and relative geometry of the second volume 626 with respect to other elements of the volumetric light emitting device 600 may be varied and preferably selected according to the particular design requirements of the lighting device without loss of generality. As previously described in FIG. 5, the second volume may be arranged in a cylindrical configuration. However, the cylinder may be configured to extend to the top reflector 615 whereby the surface area of interface 628 is determined by the lateral surface area of the cylinder. For example, by adding a second volume 626 of encapsulant 616 in the shape of a cylindrical extending to the upper reflector 615 with a height 630 of 20 mm above the reflector ring 614, the surface area of the interface 628 increases to 558.9 mm$^2$; an increase of approximately 699 percent.

As shown in FIGS. 3 through 8, there are many ways to configure the second volume to increase the surface area at the interface between the encapsulant and the phosphor particles dispersed in a resin, thereby minimizing the potential for concentrated heat build-up from the heat of down-conversion at a localized hot spot. The second volume may be configured in geometrical shapes including, but not limited to, a dome, hemisphere, cylinder, cone, paraboloid, or a combination thereof.

As the light of a first wavelength (e.g. blue light) emitted by the LED light source propagates through the encapsulant, the encapsulant may absorb some amount of the emitted light, having the effect of building up heat and reducing the output of down-converted light of a second wavelength from the volumetric light emitting device. Consequently, minimizing the distance traveled by the emitted light through the encapsulant maximizes the potential light output from the volumetric light emitting device and minimizes heat buildup. The addition of reflective surfaces or scattering material in the second volume to reflect or otherwise redirect the emitted light into the phosphor particle dispersed in the volumetric light conversion element, in part, minimizes the distance. In this way, the upper reflector may include one or more elements extending axially into the volumetric light conversion element. To enable the formation of the upper reflector elements to extend axially into the volumetric light conversion element, the upper reflector may be formed of a highly reflective thermal plastic material that is readily molded into a desired shape. One material that is contemplated for the formation of the upper reflector is titanium dioxide ($TiO_2$) though other materials may be used, singly or in combination, for example, polished aluminum.

Figure 9:
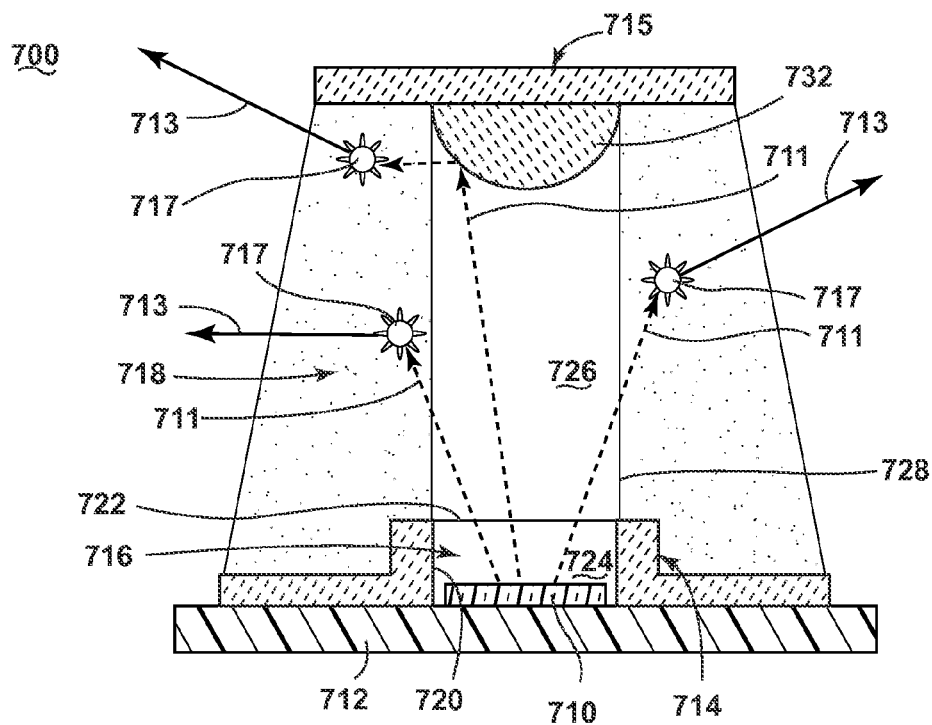
FIG. 9 illustrates a cross-sectional view of a volumetric light emitting device with a dome reflector element extending axially into the encapsulant.
Figure 10:
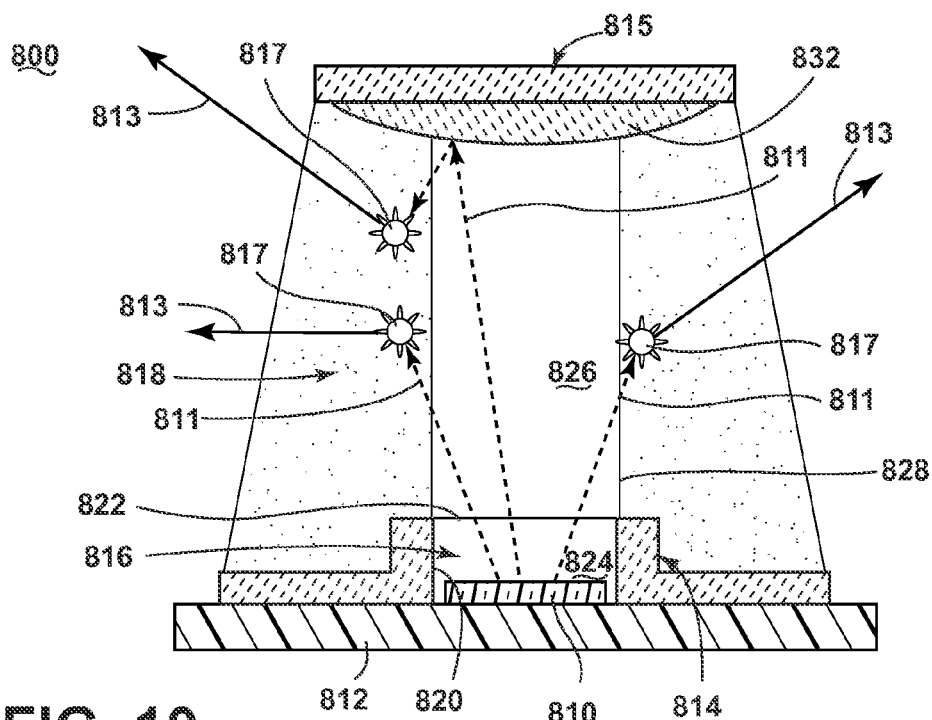
FIG. 10 illustrates a cross-sectional view of a volumetric light emitting device with a dome reflector element extending axially into the encapsulant and the volumetric light conversion element.
Figure 11:
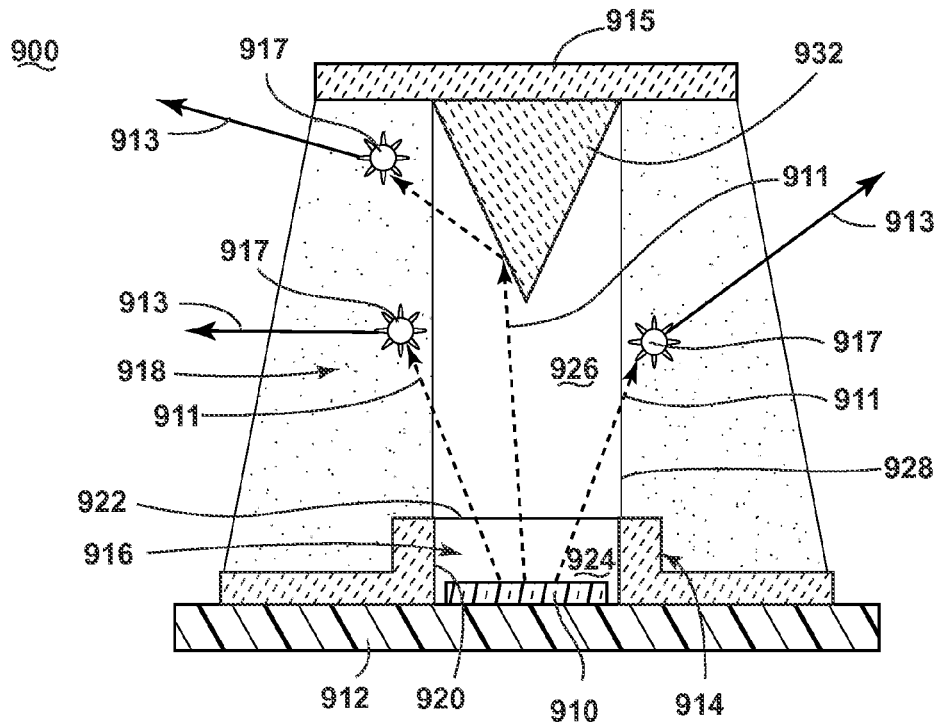
FIG. 11 illustrates a cross-sectional view of a volumetric light emitting device with a conic reflector element extending axially into the encapsulant.
Figure 12:
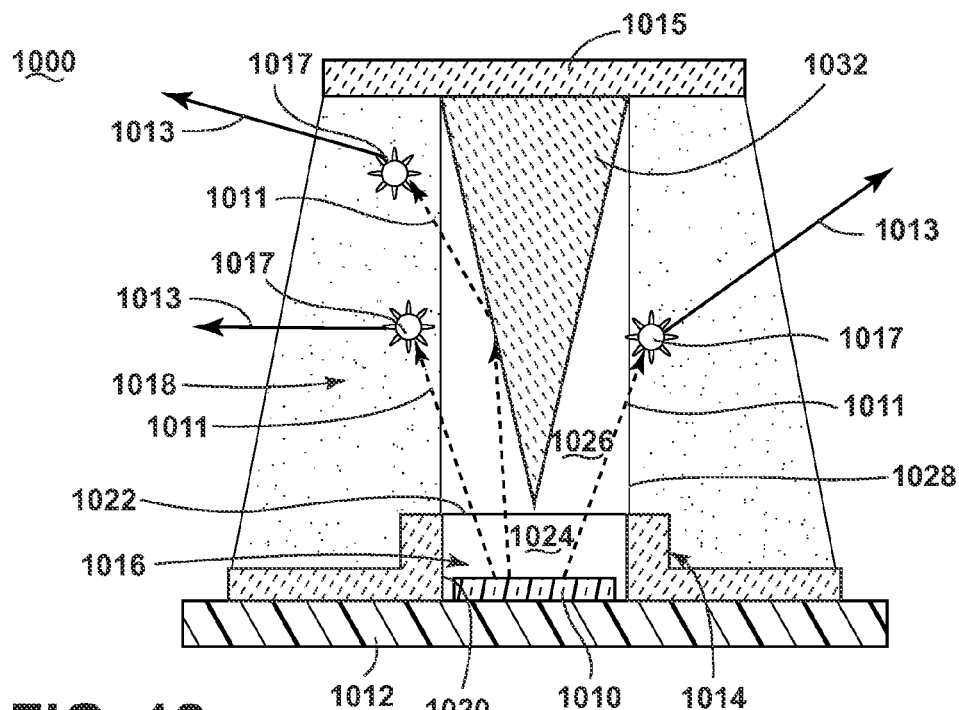
FIG. 12 illustrates a cross-sectional view of a volumetric light emitting device with an extended conic reflector element extending axially into the encapsulant.
Figure 13:
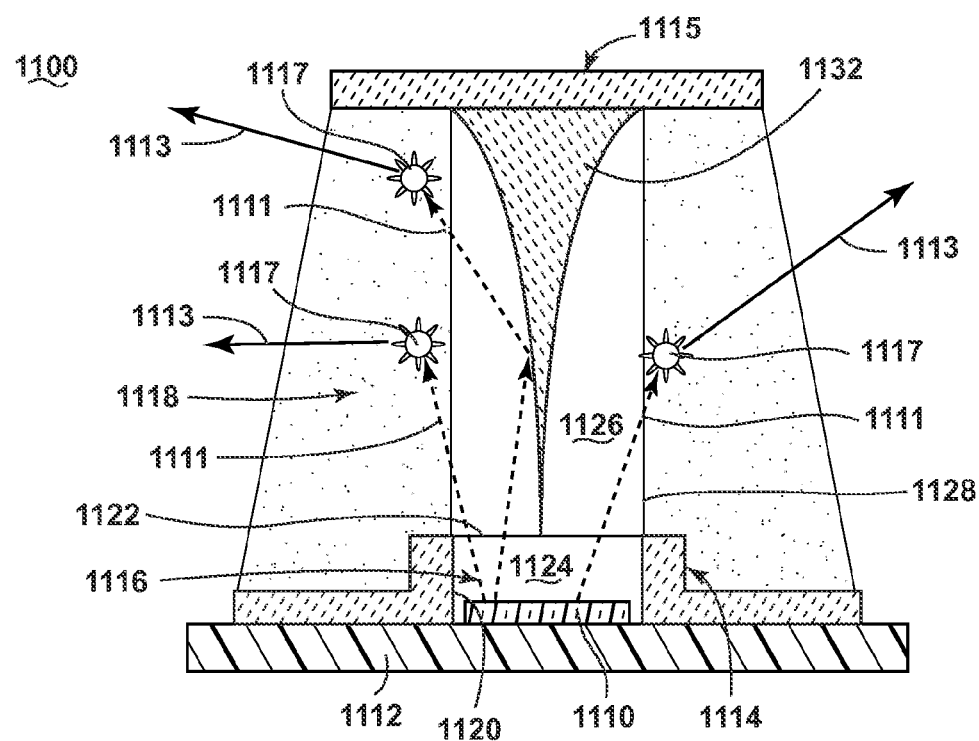
FIG. 13 illustrates a cross-sectional view of a volumetric light emitting device with a funnel shaped reflector element extending axially into the encapsulant.

FIG. 9 through FIG. 13 illustrate examples of volumetric light emitting devices similar to that illustrated in FIG. 8 where the upper reflector contains elements that extend downward into the encapsulant material where the encapsulant is formed as a cylinder. FIG. 9 illustrates a cross-sectional view of a volumetric light emitting device 700 with a dome reflector element 732 extending axially into the encapsulant 716. FIG. 10 illustrates a cross-sectional view of a volumetric light emitting device 800 with a dome reflector element 832 extending axially into the encapsulant 816 and the volumetric light conversion element 818. FIG. 11 illustrates a cross-sectional view of a volumetric light emitting device 900 with a conic reflector element 932 extending axially into the encapsulant 916. FIG. 12 illustrates a cross-sectional view of a volumetric light emitting device 1000 with an extended conic reflector element 1032 extending axially into the encapsulant 1016. FIG. 13 illustrates a cross-sectional view of a volumetric light emitting device 1100 with a funnel shaped reflector element 1132 extending axially into the encapsulant 1116.

Figure 14:
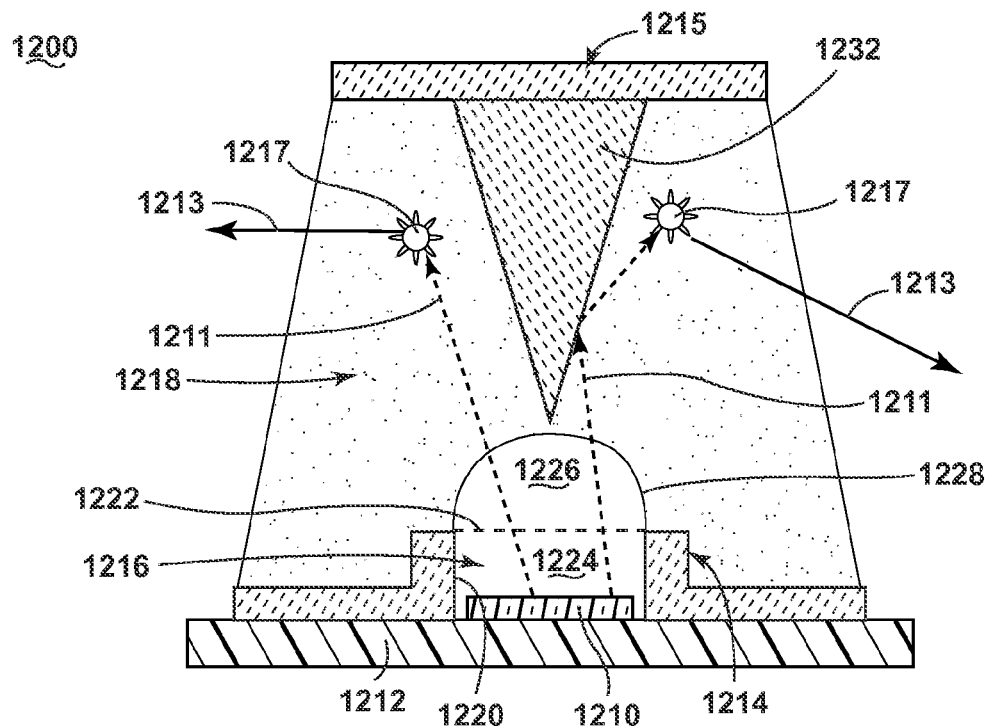
FIG. 14 illustrates a cross-sectional view of a volumetric light emitting device with a conic reflector element extending axially into the volumetric light conversion element.

The upper reflector may contain downward extending elements without the limitation of extending into the encapsulant. For example, as shown in FIG. 14 which illustrates a volumetric light emitting device 1200 similar to that illustrated in FIG. 3, elements of the upper reflector 1232 may extend into the phosphor particles 1218 dispersed in resin and not into the encapsulant 1216. FIG. 14 illustrates a cross-sectional view of a volumetric light emitting device 1200 with a conic upper reflector element 1232 extending axially into the volumetric light conversion element 1218. By forming the upper reflector with elements extending axially into the volumetric light conversion element 1218, heat generated from down-conversion transfers further away from the center of the volumetric light conversion element 1218 to the outer walls where it may more quickly dissipate.

Much of the heat dissipated from the volumetric light conversion element occurs through the exterior surface via convection or radiation to the surrounding air. As the amount of heat dissipated through convection or radiation is directly proportional to the exterior surface area of the volumetric light conversion element, increasing the external surface area of the volumetric light emitting device may dissipate more heat, or dissipate heat quicker, thereby maintaining a cooler temperature inside the volume.

Figure 15:
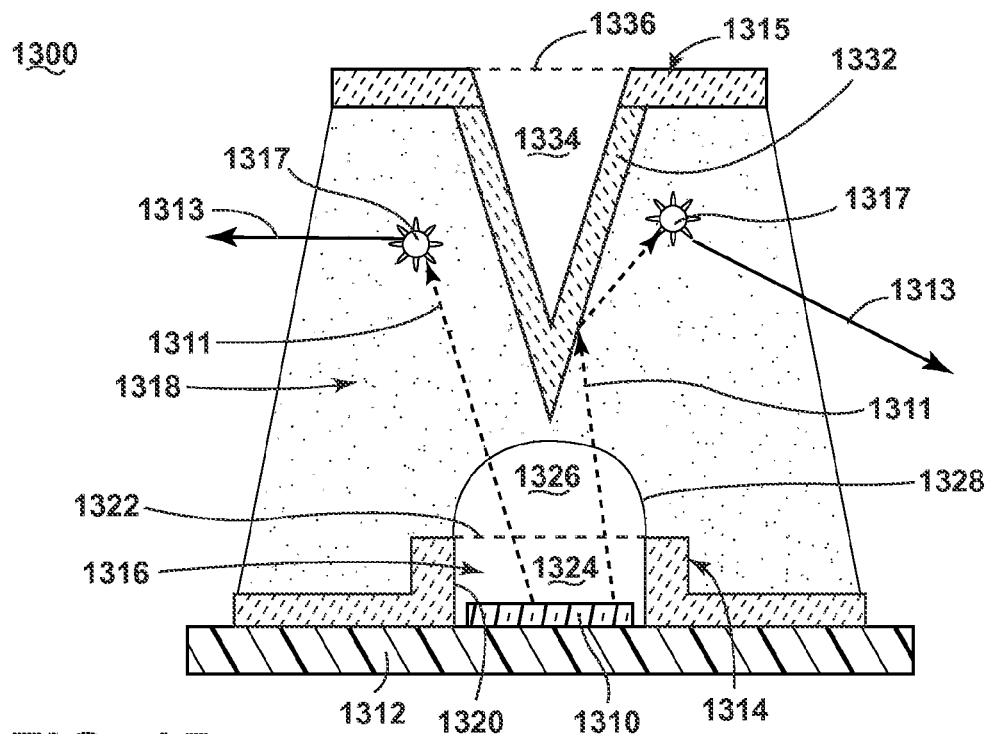
FIG. 15 illustrates a cross-sectional view of a volumetric light emitting device with a conic reflector element with increased exterior surface area extending axially into the volumetric light conversion element.

Referring now to FIG. 15, a volumetric light emitting device 1300 similar to that illustrated in FIG. 14 may include a downward extending upper reflector 1315, where the upper reflector 1315 is formed with a thin wall and an air cavity 1334 that extends downward along with an upper reflector element 1332 beyond a perimeter 1336 into the volumetric light emitting device 1300. In this way, the upper reflector 1315 forms more surface area to aid in heat dissipation and reduces the path of travel for light from the center of the LED light source 1210 to the exterior surface of the volumetric light emitting device 1300.

Figure 16:
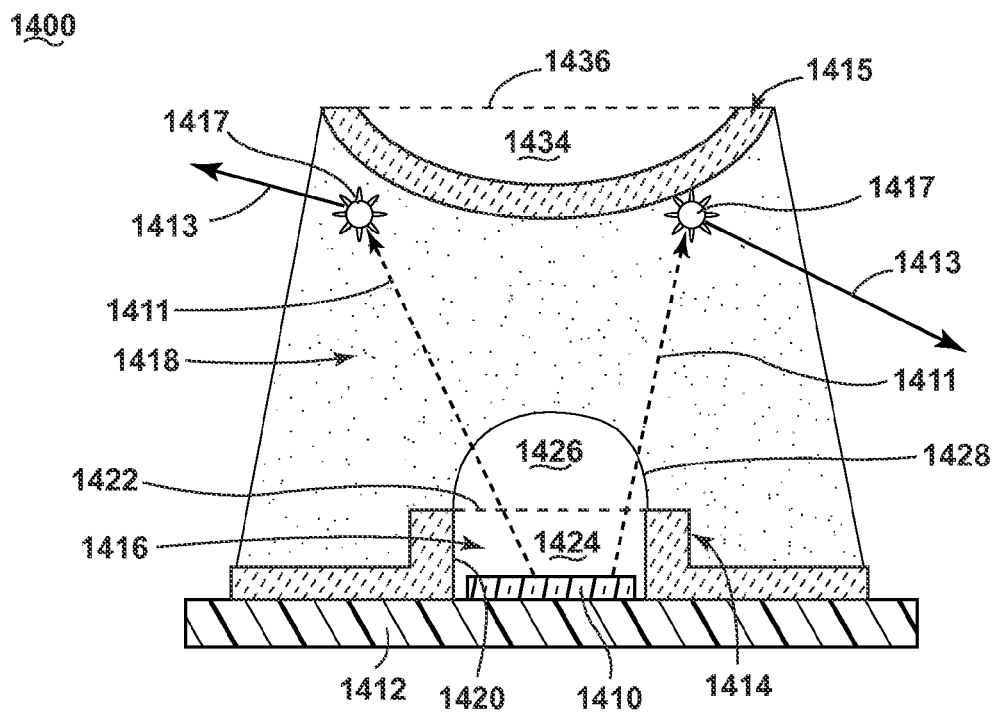
FIG. 16 illustrates a cross-sectional view of a volumetric light emitting device with a hemispherical reflector element with increased exterior surface area extending axially into the volumetric light conversion element.

Other variations of the configuration of the upper reflector are contemplated and include reflector elements shaped as a dome, a hemisphere, a cone, a cylinder, a frustoconical shape, or any combination thereof. The upper reflector may include elements extending axially into the second volume, the volumetric light conversion elements or both. For example, FIG. 16 illustrates a cross-sectional view of a volumetric light emitting device 1400 with a hemispherical upper reflector element 1415 with increased exterior surface area extending axially into the volumetric light conversion element.

Figure 17:
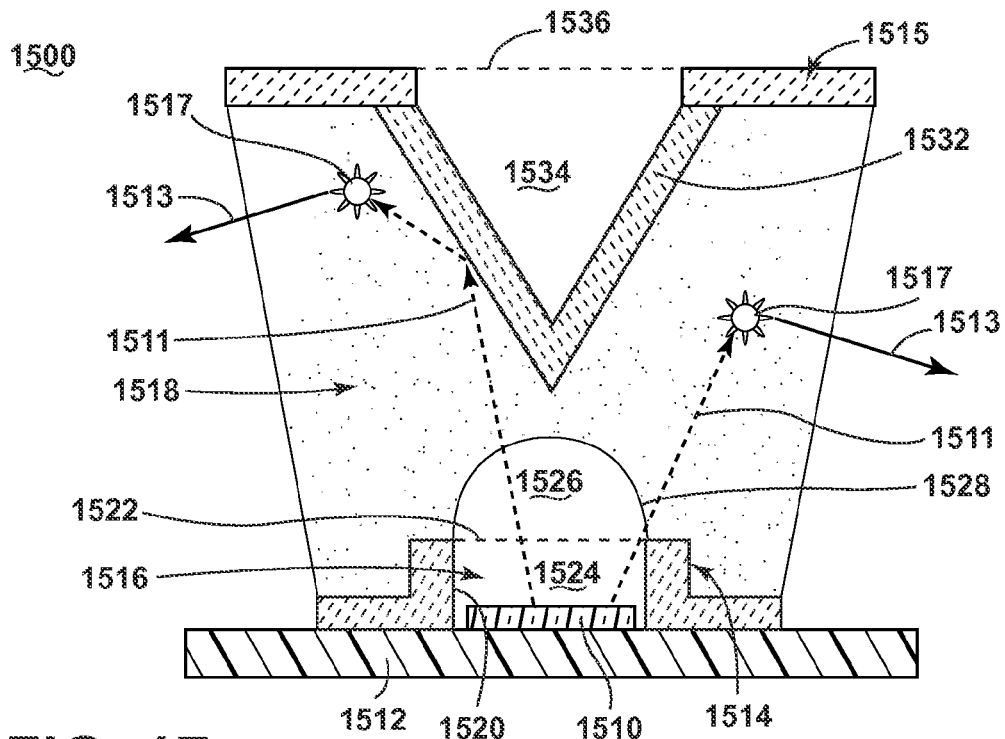
FIG. 17 illustrates a cross-sectional view of a volumetric light emitting device with a conic reflector element extending axially into the volumetric light conversion element where the diameter of the upper portion of the volumetric light conversion element is greater than the diameter of the lower portion.
Figure 18:
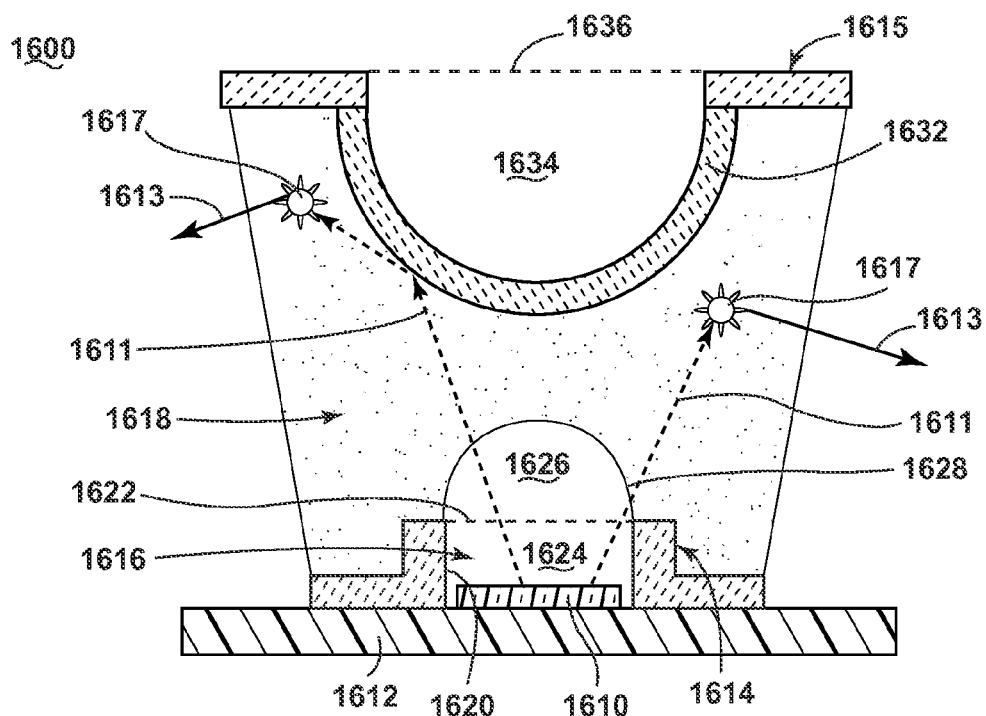
FIG. 18 illustrates a cross-sectional view of a volumetric light emitting device with a hemispherical reflector element extending axially into the volumetric light conversion element where the diameter of the upper portion of the volumetric light conversion element is greater than the diameter of the lower portion.

While volumetric light conversion elements previously illustrated show a larger diameter near the lower reflector ring and a smaller diameter near the upper reflector, the volumetric light emitting device may include a volumetric light conversion element in which the diameter is larger near the upper reflector than the lower reflector ring. FIG. 17 illustrates a cross-sectional view of a volumetric light emitting device 1500 with an upper reflector 1515 that includes a conic reflector element 1532 extending axially into the volumetric light conversion element 1518 where the diameter of the upper portion of the volumetric light conversion element is greater than the diameter of the lower portion. FIG. 18 illustrates a cross-sectional view of a volumetric light emitting device 1600 with an upper reflector 1615 that includes a hemispherical reflector element 1632 extending axially into the volumetric light conversion element 1618 where the diameter of the upper portion of the volumetric light conversion element is greater than the diameter of the lower portion. The configuration of the volumetric light conversion elements 1518, 1618 enable a larger and deeper downward extending cavity in the upper reflectors 1515, 1615 that further increases the exterior surface area of the volumetric light emitting devices 1500, 1600 and creates a shorter path from the center of the LED light sources 1510, 1610 to the respective exterior surface to enhance heat dissipation. In this way, the ratio of lower diameter to upper diameter of the volumetric light conversion element may be 0.75:1 but may range from 0.5:1 to 1.0:1, though other ratios may be considered.

The additional surface area of the upper reflector and the larger diameter of the upper portion of the volumetric light conversion element with respect to the diameter of the lower portion may affect the distribution of the light output from the volumetric light emitting device. For example, a volumetric light conversion element with a larger diameter upper portion may minimize the opportunity for the first wavelength light (e.g. blue light emitted from an LED light source) to output from volumetric light conversion element before exciting a phosphor and down-converting light of a second wavelength. Consequently, the upper reflector may be formed with less scattering material than the lower reflector ring to adjust the reflectivity and transmission of light reflected from the upper reflector. Decreasing the scattering material applied in the formation of the upper reflector may allow more light transmission through the upper reflector and decrease light reflection back into the volumetric light emitting device.

In general, making the reflectivity of the upper reflector less than that of the lower reflector ring may benefit the volumetric light emitting device to control the light distribution pattern, particularly in the upward direction where much of the light is often blocked by the upper reflector. With certain reflective materials, the lower reflector ring may have a reflectivity up to approximately 97 percent. The reflectivity of the top reflector can be reduced thereby increasing the light transmission through the top reflector. The transmission of the upper reflector may be increased depending on the desired light output pattern. In this way, controlling the amount of scattering material applied to the upper reflector elements may increase the transmission from 1 percent to 10 percent or from 10 percent to 50 percent. The scattering material may be made of generally reflective materials or other materials such as TiO$_2$, quantum dots, nano-particles.

Figure 19:
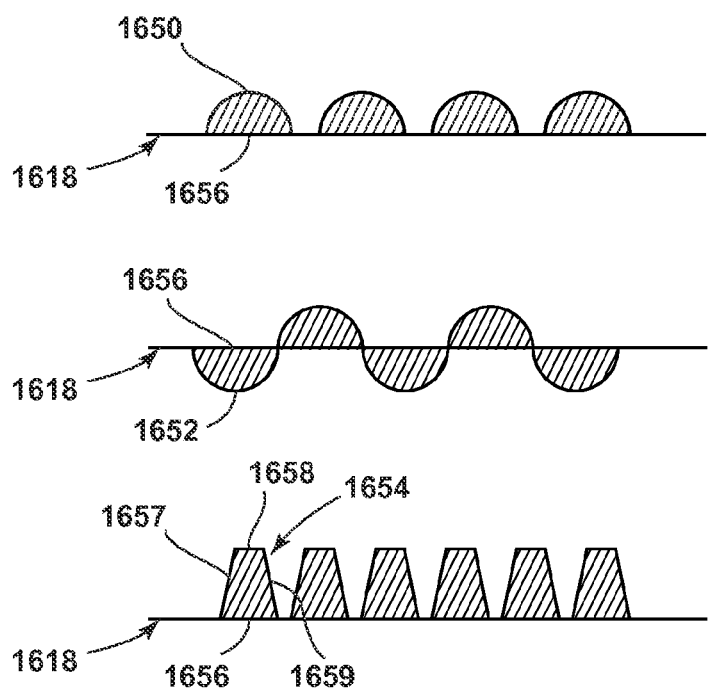
FIG. 19 illustrates additional structures including hemispheres, waves and ribs added to the exterior of the volumetric light conversion element.
Figure 20:
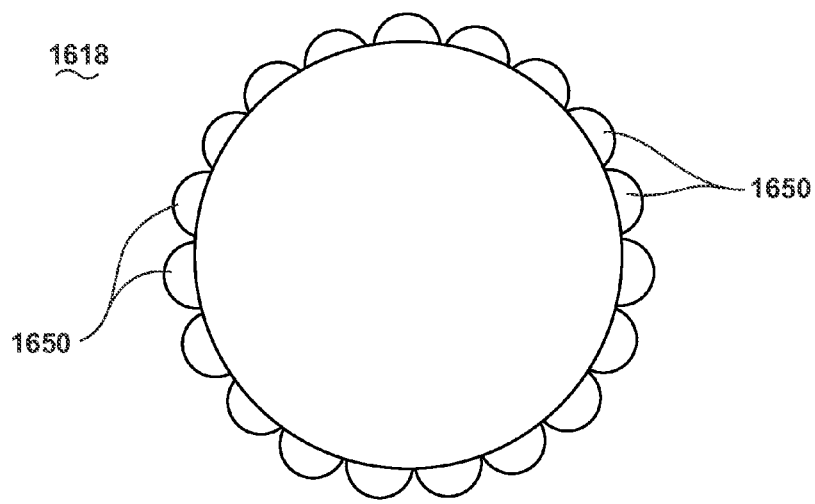
FIG. 20 illustrates a cross section of the volumetric light conversion element with hemispheres on the exterior to dissipate heat according to an embodiment.

The surface area of the volumetric light conversion element may also be increased to increase heat dissipation and minimize the average temperature within the volumetric light conversion element. FIG. 19 illustrates a portion of a lateral cross-section of a volumetric light conversion element 1618 showing additional structures on the surface thereof for increasing the external surface area. The structures include hemispheres 1650, waves 1652, and/or ribs 1654 that augment the smooth exterior surface of a volumetric light conversion element 1618 to a roughened surface with more area. Each hemisphere 1650 located on the exterior surface of the volumetric light conversion element 1618 augments a flat surface 1656 area of the surface of the volumetric light conversion element 1618. Similarly, the exterior surface of the volumetric light conversion element may be formed as a sinusoidal wave 1652, replacing the flat surface 1656 with a larger area described by a sinusoidal function. Alternatively, the exterior surface of the volumetric light conversion element may be formed as ribbed element 1654, replacing the flat surface 1656 with the summation of flat surface elements 1657, 1658, 1659 forming protrusions along the exterior of the volumetric light conversion element 1618. FIG. 20 illustrates a lateral cross-section of the volumetric light conversion element 1618 with hemispheres 1650 on the exterior surface to further dissipate heat. Other shapes and configurations for increasing the exterior surface area of the volumetric light conversion element may be implemented.

Figure 21:
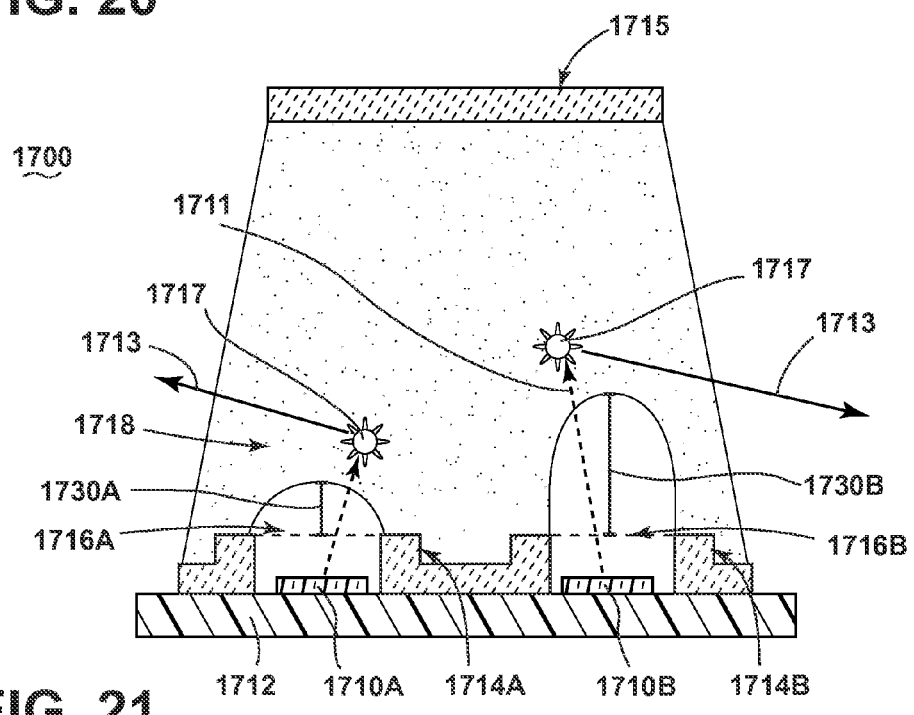
FIG. 21 illustrates a volumetric light emitting device with multiple LED's spaced concentrically.

FIG. 21 illustrates a volumetric light emitting device 1700 with multiple semiconductor LED light sources 1710A, 1710B arranged concentrically on the substrate 1712. By implementing multiple LED light sources 1710A, 1710B at independent locations, the emitted light of the first wavelength (e.g. blue light) may be distributed over a larger area, thus minimizing heat concentration due to down-conversion and locating a majority of down-converted light closer to the exterior surface of the volumetric light conversion element 1718. Each of the LED light sources 1710A, 1710B may have a corresponding reflector ring 1714A, 1714B and encapsulant 1716A, 1716B. Furthermore, the configuration including dimensions such as height 1730A, 1730B of the encapsulants 1716A and 1716B may differ to optimize or distribute the areas of heat concentration due to down-conversion and optimize light distribution.

Figure 22:
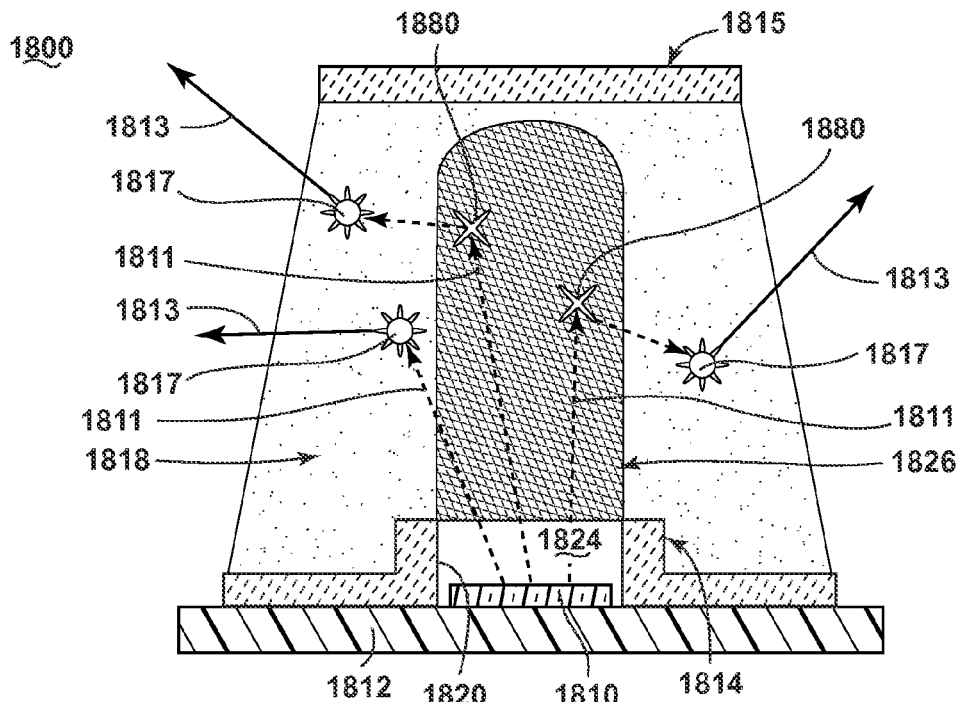
FIG. 22 is a representative illustration of a volumetric light emitting device with scattering material according to an embodiment.

Referring now to FIG. 22, a representative illustration of a volumetric light emitting device 1800 with scattering material in a second volume 1826 is shown. To disrupt the directional nature of the blue light emitted from the LED light source 1810 and distribute the light throughout the phosphors 1817 dispersed in the resin of the volumetric light conversion element 1818, the second volume 1826, formed as any of the shapes discussed above in FIGS. 3 through 8, may include scattering material such as TiO$_2$. As shown, light of a first wavelength 1811 emitted from the light source 1810 may contact the scattering material 1880 and be redirected to a phosphor 1817 in the volumetric light conversion element 1818 where down-conversion occurs and light of a second wavelength 1813 transmits out of the volumetric light emitting device 1800. The scattering material 1880 may be uniformly distributed or distributed in a gradient with the lowest density adjacent the first volume 1824, increasing to a higher density as the second volume 1826 approaches the upper reflector 1815. The scattering material may be made of generally reflective materials or other materials such as TiO$_2$, quantum dots, nano-particles, or may simply comprise small voids or bubbles in the encapsulant or resin materials that may cause the impinging rays of light to change direction when passing through.

Light may also be directed or scattered using materials formed with designed geometries and selected indices of refraction. Snell's law characterizes the reflection and refraction of light when impinging on an interface between two volumes of differing indices of refraction. For example, the second volume may have a first index of refraction and the volumetric light conversion element may have a second index of refraction that is different than the first index of refraction. Depending on the index of refraction of the different materials, and the geometry of the interface between them, light may be directed or scattered in ways desirable to optimize the light output from the volumetric light-emitting device. Implementing different materials with selected refractive indexes can distribute light to provide a more homogeneous distribution of phosphor excitation and more optimally distribute the heat generated from down-conversion from a first wavelength to a second wavelength.

Figure 23:
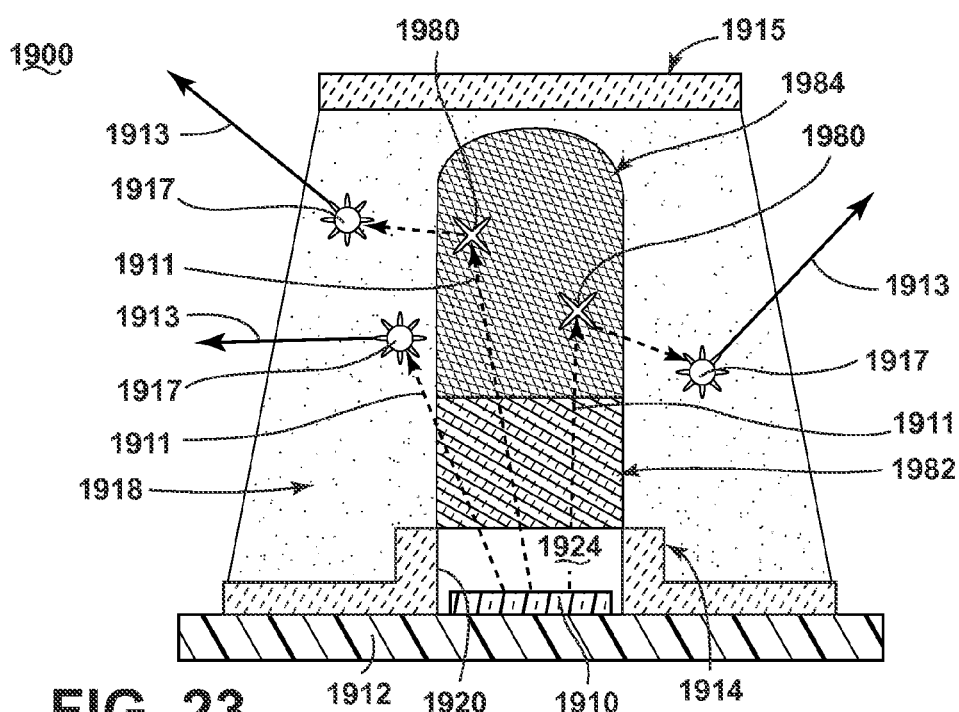
FIG. 23 illustrates a first volume of scattering material with a lower density mix and a second volume of scattering material with a higher density mix.

Referring now to FIG. 23, a representative illustration of a volumetric light emitting device 1900 with layers of scattering material is shown. The scattering material 1880 is distributed in a first volume 1982 with a lower density mix and a second volume 1984 with a higher density mix. An alternative to applying the scattering material in a gradient density, multiple levels of scattering material in an encapsulant may be provided. The density of scattering material in each layer may determine the level of scattering to optimize the blue light distribution and manage the phosphor excitation of the phosphor particles dispersed in resin.

In addition to the above-described invention, an additional advantage of a volumetric light emitting device with a lower internal maximum temperature includes an increased lumen output. That is, the volumetric light emitting device may operate with an increased power output of the LED without exceeding material limitations. For example, without a second volume of scattering material or encapsulant as described above, the maximum lumen output might be 800-1200 lumens due to material temperature limitations. However, with a second volume dispersing heat and reducing the maximum internal temperature, the lumen output may potentially increase by 50 to 400 lumens.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:
1. A volumetric light emitting device comprising:
   a substrate;
   at least one semiconductor light emitting diode disposed on the substrate;
   a reflector ring extending axially from the substrate and surrounding the at least one semiconductor light emitting diode, the reflector ring defining a first volume bounded by the substrate, an inner wall of the reflector ring, and a terminal plane at a distal end of the reflector ring;

an encapsulant filling the first volume and encapsulating the at least one semiconductor light emitting diode;

a volumetric light conversion element surrounding the reflector ring and the first volume wherein the volumetric light conversion element is adapted to down-convert light emitted from the at least one semiconductor light emitting diode at a first wavelength and emit the down-converted light at a second wavelength; and a second volume of encapsulant or scattering material extending axially between the terminal plane and the volumetric light conversion element.

2. The volumetric light emitting device of claim 1 wherein the volumetric light conversion element comprises a resin with phosphor particles dispersed therein.

3. The volumetric light emitting device of claim 1 wherein the second volume is one of a dome, a hemisphere, a cone, a cylinder, a frustoconical shape, or any combination thereof.

4. The volumetric light emitting device of claim 1 further comprising an upper reflector spaced axially from the terminal plane and providing an upper boundary for the volumetric light conversion element.

5. The volumetric light emitting device of claim 4 wherein the upper reflector includes one of a dome, a hemisphere, a cone, a cylinder, a frustoconical shape, or any combination thereof extending axially into the volumetric light conversion element.

6. The volumetric light emitting device of claim 4 wherein the upper reflector includes one of a dome, a hemisphere, a cone, a cylinder, a frustoconical shape, or any combination thereof extending axially into the second volume.

7. The volumetric light emitting device of claim 4 wherein a surface of the upper reflector away from the volumetric light conversion element includes a cavity to facilitate heat dissipation.

8. The volumetric light emitting device of claim 3 wherein the second volume comprises at least one third heat dissipation volume extending into the volumetric light conversion element.

9. The volumetric light emitting device of claim 1 wherein a surface area of the volumetric light conversion element includes at least one of a rib, a wave, an arc, a hemisphere or a cone.

10. The volumetric light emitting device of claim 1 wherein the second volume comprises a scattering material.

11. The volumetric light emitting device of claim 10 wherein the scattering material comprises titanium oxide.

12. The volumetric light emitting device of claim 10 wherein the scattering material comprises a density mix distributed in a gradient with the lowest density adjacent the first volume.

13. The volumetric light emitting device of claim 10 wherein the scattering material comprises a first lower density and higher second density and the first lower density is adjacent the first volume.

14. The volumetric light emitting device of claim 1 wherein the second volume comprises an encapsulant.

15. The volumetric light emitting device of claim 1 comprising multiple semiconductor light emitting diodes arranged concentrically on the substrate.

16. A volumetric light emitting device comprising:
a substrate;
at least one semiconductor light emitting diode (LED) disposed on the substrate;
an encapsulant enveloping and encapsulating the at least one semiconductor LED; and
a volumetric light conversion element surrounding the encapsulant wherein the volumetric light conversion element is adapted to down-convert light emitted from the at least one semiconductor LED at a first wavelength and emit the down-converted light at a second wavelength
wherein the interface between the encapsulant and the volumetric light conversion element is one of a dome, a hemisphere, a cone, or any combination thereof so as to provide an enlarged surface area at the interface.

17. The volumetric light emitting device of claim 16 wherein the substrate includes a reflective surface.

* * * * *